AVALANCHE DIODE FOR GENERATING OSCILLATIONS UNDER
QUASI-STATIONARY AND TRANSIT-TIME CONDITIONS
Filed Dec. 29, 1966 3 Sheets-Sheet 1

United States Patent Office 3,483,441

Patented Dec. 9, 1969

3,483,441

AVALANCHE DIODE FOR GENERATING OSCILLATIONS UNDER QUASI-STATIONARY AND TRANSIT-TIME CONDITIONS

Bernd Hofflinger, Munich, Germany, assignor to Siemens Aktiengesellschaft, a corporation of Germany Filed Dec. 29, 1966, Ser. No. 605,915

Claims priority, application Germany, Dec. 30, 1965, S 101,271; May 12, 1966, S 103,766

Int. Cl. H01l 3/00, 5/00

U.S. Cl. 317—234 11 Claims

ABSTRACT OF THE DISCLOSURE

An avalanche diode whose semiconductor crystal has a space-charge region of relatively low dopant concentration bordered on electrically opposite sides by contact-carrying outer zones of high dopant concentration and mutually opposed types of conductivity so that the intermediate space charge region forms a p-n junction with one of the outer zones. Operating voltage is applied in the inverse direction. The intermediate zone has a dopant concentration of such magnitude, at least adjacent to the p-n junction, that the charge carriers produced by the operating voltage near the p-n junction induce by multiplication an amplified space charge avalanche in the intermediate-zone portion away from the junction. The avalanche carriers counteract the operating voltage and cause a descending diode characteristic (negative resistance).

My invention relates to an avalanche diode for amplification or generation of high-frequency oscillations of high power within a large frequency range, and has for its main object to provide a diode of this type that is suitable for operation under quasi-stationary as well as for transit-time operating conditions.

The so-called Read diode (W. T. Read: Bell Sys. Tech. J., vol. 37, page 401, 1958) has an $n^{++}$-$p^{+}$-p-$p^{++}$ or $n^{++}$-$p^{+}$-i-$p^{++}$ dopant profile. The $n^{++}$-$p^{+}$ junction is abrupt. The $p^{+}$ zone is so narrow that, when breakthrough occurs, the space charge zone reaches up to the p-$p^{++}$ junction and at this locality the field is still larger than approximately 10 kv./cm. Impressed upon the diode in the reverse (blocking) direction is a voltage of sufficient magnitude to make the field strength in the entire space charge zone ($p^{+}$-p) so high (10 kv./cm.) that "hot" charge carriers, i.e. carriers having a saturation speed of $10^7$ cm./sec., will be produced, and that the free charge carriers are drained from the space charge zone. The energy of the "hot" charge carriers in the peak field at the $p^{++}$-$p^{+}$ junction is supposed to become so large that these carriers can produce electron-hole pairs and thus cause a carrier avalanche.

The effects of travel-time responsive injections have been investigated for the following cases of operation:

(1) Unilateral multiplication in $p^{++}$-$n^{+}$-i-$n^{++}$ structures at small injection densities. (Read, supra; and M. Gildren and M. E. Hines: Solid State Device Research Conference, June 1965, Princeton).

(2) Homogeneous multiplication in homogeneous fields (T. Misawa: Proc. IEEE vol. 53, page 1236, September 1965).

The theories according to these publications are limited to stationary current densities at which a space charge reaction effect is negligible.

In Read operation, one-half of the period duration $\pi\omega^{-1}$ of the oscillation is to approximate the carrier travel time $\tau$, and the optimal oscillation frequency is to be determined by the travel angle $\theta=\omega\tau=\pi$. The oscillatory properties of the diode proposed by Read worsen with increasing current. This current limits the possible current amplitudes of the oscillation and consequently the power.

It is desirable and constitutes another object of my invention to employ avalanche diodes as oscillators at extremely high frequency which afford large negative conductivity values and correspondingly high oscillatory power quantities in travel time operation and which can be operated quasi-stationarily, below the limit frequency for transit-time conditions, in order to develop oscillatories of very wide band characteristic To this end, and in accordance with my invention, I employ an avalanche diode having two opposingly and highly doped marginal or outer zones of a semiconductor crystal, particularly a semiconductor monocrystal, these two zones being provided with respective contacts, and having an intermediate region of lower dopant concentration bordered by the outer zones and acting as a space charge zone during diode operation. The intermediate region of comparatively low dopant concentration forms a p-n junction with at least one of the two outer regions and has such a length that the charge carriers can attain saturation speed when the operating voltage is applied in the blocking direction between the outer-zone contacts. In such an avalanche diode, and in accordance with a feature of my invention, the space charge zone, at least in its portion adjacent to the p-n junction, is doped to such an extent that the charge carriers produced at this p-n junction when the operating voltage is applied, induce an avalanche space charge amplified by multiplication, in the region of the space charge zone that is separated from the p-n junction by part of this same zone and is located near the other outer zone, the avalanche space charge being sufficient to partly compensate the operating voltage so as to provide for a descending current-voltage characteristic of the diode.

According to another feature of the invention, a negative resistance of an avalanche diode under quasi-stationary operating conditions is achieved by dimensioning the space charge zone so short and by so highly doping the space charge zone at least in its portion adjacent to the p-n junction, that under the applied operating voltage the transit time of the majority charge carriers resulting from multiplication at the p-n junction is small relative to the duration of the cycle period of the generated oscillations, and that the amount of the avalanche space charge caused by these charge carriers compensates the operating voltage to the extent required for producing a descending diode characteristic.

Furthermore, the length and the dopant concentration of the space charge zone are to be so dimensioned that when operating the diode, a field strength larger than the approximate amount of 5 kv./cm. will obtain at the side of the space charge zone remote from the p-n junction when the breakthrough field strength $E_B$ is reached at the reversely biased p-n junction.

If the avalanche diode has an $n^{++}$-$p^{+}$-p-$p^{++}$ or $n^{++}$-$p^{+}$-i-$p^{++}$ doping profile (the plus signs denoting the different dopant concentrations), the following stationary operating conditions in the blocking direction are possible:

First condition: The applied blocking voltage is just large enough for all free charge carriers to be extracted out of the $p^{+}$-p region and for the space charge field, caused by the acceptors, to extend just over the $p^{+}$-p zone.

Second condition: The voltage is increased over that of condition 1 and raises the field profile to such an extent that the peak field strength reaches the value $E_C$ in the region of the $p^{+}$ zone adjacent to the $n^{++}$ zone. Denoted by $E_C$ is the peak field at which the carrier multiplication in the space charge zone attains the threshold magnitude at which avalanche breakthrough takes place.

Third condition: The applied voltage is further increased relative to condition 2. This raises the field profile so that it exceeds the value $E_C$ within a small zone. A multiplication current now flows. This current is a pure hole current in the main portion of the space charge zone outside of the multiplication region. Near the $n^{++}$-$p^{+}$ junction the current is essentially an electron current. This results in the space charge $s'$ and the corresponding field strength E′. The field strength E′ is superimposed upon the field profile in condition 2. Hence current and voltage are increased relative to condition 2.

Fourth condition: Due to the high space charge of the hole current, the field strength at the p-$p^{++}$ junction has increased to such an exent that it induces a carrier multiplication increasing toward the margin (outer)zone. Additional electrons travel from this multiplication region to the p-n junction so that the hole space charge is partially compensated and the field strength reduced. As a result, the area beneath the field-strength curve becomes smaller; that is, the voltage decreases with increasing current. In this stationary condition the diode has a descending characteristic, constituting a negative resistance.

The above-described mechanism, as has been found by investigations in conjunction with the present invention, is particularly favorable if the lengths of the $p^{+}$ and p zones are of the same order of magnitude. This is especially the case with structures that are to operate at highest technological frequencies (larger than about 5 gHz.). This requires producing space charge zones whose lengths are smaller than 10 $\mu$m. Investigation has further shown that with very short space charge zones (smaller than 3 $\mu$m.) the p zone can be omitted, and that negative resistances can be produced exclusively by unilateral injection in the $p^{+}$ zone.

In an avalanche diode having a $p^{++}$-$p^{+}$-$n^{++}$ or $p^{++}$-$n^{+}$-$n^{++}$ doping profile, the avalanche injection during operation occurs unilaterally from the reversely biased p-n junction; and according to the invention, the length of the space charge zone is to be so dimensioned that the field strength in the intermediate region but remote from the mentioned p-n junction is between 0.5 and 0.2 $E_B$. Denoated by $E_B$ is the breakthrough field strength at the p-n junction. Furthermore, also in accordance with the invention, the charge carrier density $J/v$, corresponding to the curent density J, during operation should be approximately equal to 0.5 to 1 times the dopant atom concentration, i.e. 50% to 100% of the $p^{+}$ concentration. The doping of the $p^{+}$ zone preferable according to the invention is $10^{16}$ cm.$^{-3}$, and the length of the $p^{+}$ zone is approximately 1.5 to 0.8 $\mu$m.

In an avalanche diode whose space charge zone is composed of two regions of lower dopant concentration, the following doping profiles are preferable for the quasi-stationary operation:

$n^{++}p^{+}$-p-$p^{++}$ $n^{++}$-$p^{+}$-i-$p^{++}$ $p^{++}$-$n^{+}$-i-$n^{++}$ $p^{++}$-$n^{+}$-n-$n^{++}$

With any one of these doping profiles, the avalanche injection in the diode takes place from the $n^{++}$-$p^{+}$ or $p^{++}$-$n^{+}$ junction with an induced multiplication in the i- or n- or p-zone, commencing at given current densities.

According to the invention, the two inner-zone regions of the avalanche diode are to have approximately the same length, and the doping of this space charge zone, comprising two regions of relatively low dopant concentration, is to be so effected that the field strength in the region away from the reversely biased p-n junction, i.e. in the i- or p- or n-zone, is larger at avalanche breakthrough than approximately 5 kv./cm. and smaller than approximately 0.5 times the breakthrough field strength $E_B$ at the mentioned p-n junction. In operation, the charge carrier density $J/v$, corresponding to the current density J, is to be larger than approximately 0.5 times the dopant atom concentration.

According to another feature of the invention, a negative resistance of an avalanche diode is obtained under transit-time conditions by so highly doping the space charge zone, at least in the portion adjacent to the p-n junction, that the charge carriers, produced at this p-n junction with an applied operating voltage, have the effect of producing near the outer zone remote from the p-n junction an avalanche space charge which is amplified by multiplication and which compensates the operating voltage to the extent required for obtaining a descending diode characteristic. Due to this avalanche space charge the essential multiplication regions are located near the ends of the space charge zone, and the density waves of positive and negative charge carriers are coupled in these regions by multiplication. The space charge zone, relative to the saturation speeds of the two charge carrier types determined by the semiconductor material of the diode, is given such a dimension of length that, with the applied operating voltage, the transit times of the charge carriers resulting from multiplication at the p-n junction, as well as the transit times of the opposed-type carriers resulting from induced multiplication at the opposite end of the space charge zone, are approximately an odd multiple of one-quarter of the cycle period of the oscillations to be amplified or excited.

The mechanism of a transit-time dependent avalanche injection with induced multiplication may be described by a low-signal theory. On account of the intensive localization of the multiplication zones at the margins of the space charge zone, it is assumed in this theory that the essential carrier multiplication takes place in regions having the lengths $l_p$, $l_n$ with a linear course of the field (FIG. 1), and that these regions have the same effect as regions which are subjected to a constant field ($E_p$, $E_n$) and have given effective lengths ($x_p$, $x_n$).

The invention will be further described with reference to the accompanying drawings in which.

Figure 3:
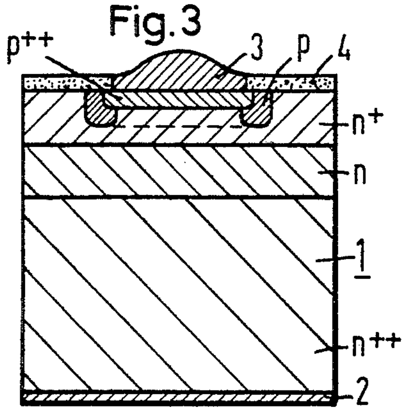
Figure 4:
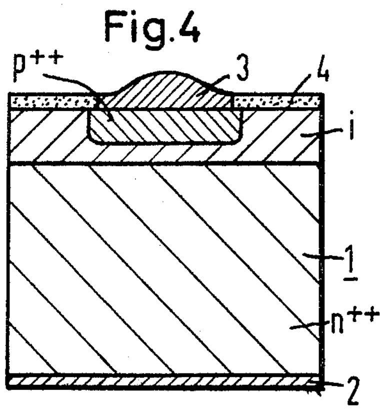
Figure 5:
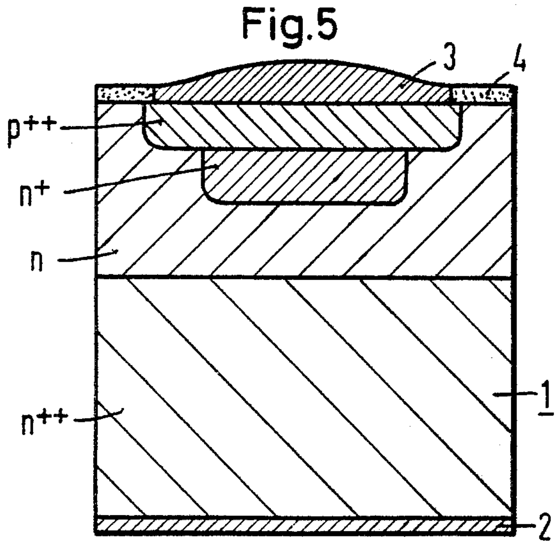

FIGS. 3, 4 and 5 exemplify, by schematic sectional views, three different embodiments of avalanche diodes respectively according to the invention.

Figure 6:
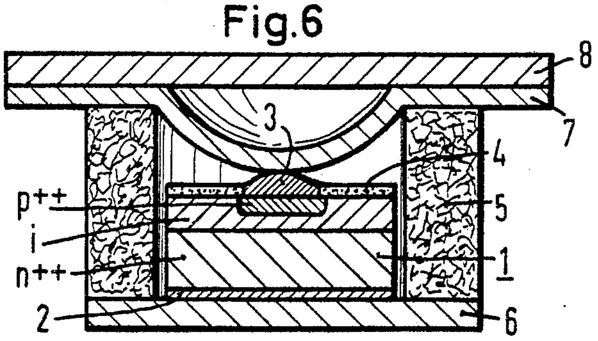

FIG. 6 is a section through an encapsulated diode corresponding substantially to that shown in FIG. 5.

Figure 7:
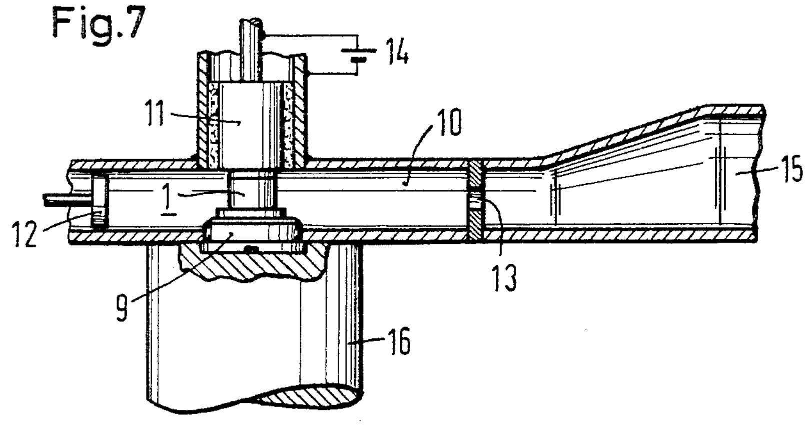

FIG. 7 is a sectional view of an oscillator comprising a diode according to the invention.

Figures 8, 9:
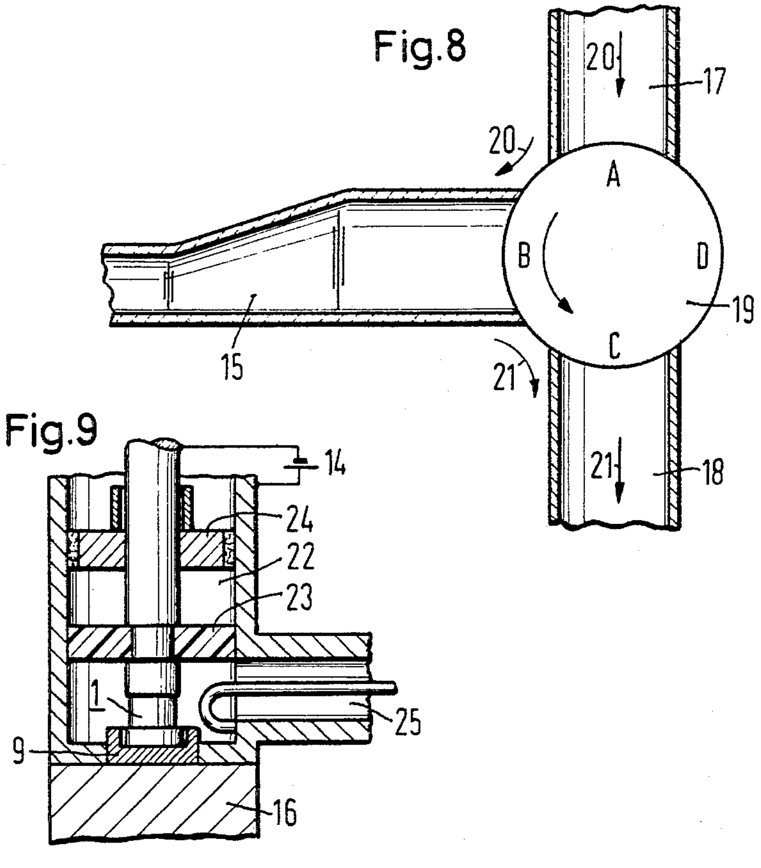

FIG. 8 shows schematically an amplifier according to the invention, comprising an oscillator as shown in FIG. 7; and FIG. 9 is a section of another oscillator with an avalanche diode according to the invention.

Figure 1:
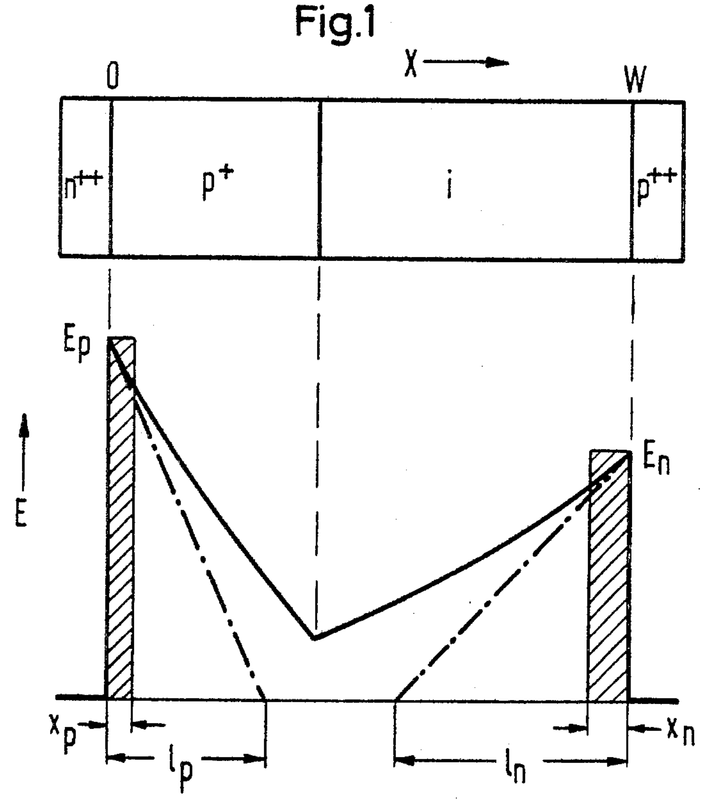
FIG. 1 is explanatory, representing in its upper portion a diagram of an avalanche diode according to the invention with an indication of the symbols already mentioned above, the lower portion of FIG. 1 being a correlated field distribution.

Referring first to FIG. 1, there is represented a typical field distribution and the equivalent multiplication regions in the space charge zone of an $n^{++}$-$p^{+}$-i-$p^{++}$ diode at high breakthrough current density.

The above-mentioned theory applies for current densities or field distributions at which these effective lengths are small relative to the length of the space charge zone. Thus, there results a configuration in which one drift zone of the length W is bordered and limited by two multiplication regions of which each has a homogeneous field distribution. The transit-time dependent carrier injection into the drift zone can be described by reference to hole $p$ or electron $n$ injection waves. The coupling between these two waves can be represented in principle as explained presently with reference to FIG. 2.

If an electron wave, injected at $x=W$, and having its time curve at this locality determined by $J_{nr}$, enters into the multiplication region ($J_{nl}$) located at $x=O$ and occurring after elapse of one-quarter of one cycle period, then a multiplication and corresponding reverse injection of a hole wave takes place. This occurs—as seen from a coarse inspection of the non-stationary continuity equation—with approximately $\pi/2$ phase displacement ($J_{pl}$). The hole wave, during the same transit time and again after elapse of one-quarter cycle period, reaches the locality $x=W(J_{pr})$, where the reverse injection of an electron wave takes place in the correct phase relation.

Hence, this effect, called multiplication feedback coupling, is advantageous when the transit time corresponds to a quarter wave period, and disadvantageous if it amounts to one-half of the wave cycle period. In detail, the theory of the multiplication factors and the field effects associated with the injection waves are to be taken into account.

Figure 2:
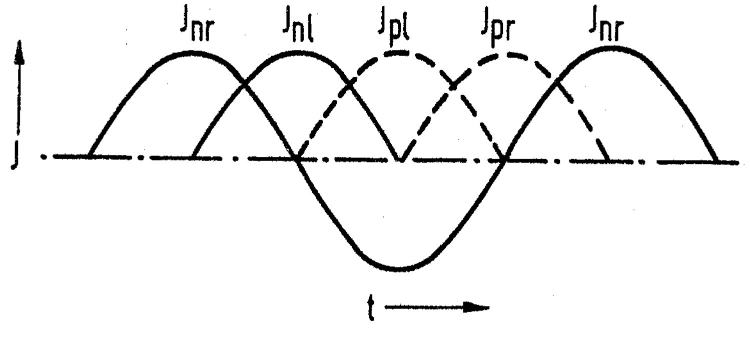
FIG. 2 is another explanatory diagram relating to the performance of avalanche diodes according to the invention.

The principle of this multiplication feedback coupling between electron ($J_n$) and hole ($J_p$) injection waves is diagrammatically represented in FIG. 2.

In an avalanche diode whose space charge zone consists of two regions of relatively low dopant concentration, preferably the following doping profiles are feasible for transit-time operation:

$n^{++}$-$p^{+}$-p-$p^{++}$
$n^{++}$-$p^{+}$-i-$p^{++}$
$p^{++}$-$n^{+}$-i-$n^{++}$
$p^{++}$-$n^{+}$-n-$n^{++}$
$n^{++}$-$p^{+}$-n-$p^{++}$
$p^{++}$-$n^{+}$-p-$n^{++}$

The plus signs again denote the differently high dopant concentrations. When operating a diode having any one of these doping profiles, the avalanche injection occurs from the $n^{++}$-$p^{+}$ or $p^{++}$-$n^{+}$ junction, and an induced multiplication, commencing at a given current density, occurs in the region remote from the reversely biased p-n junction, i.e. in the i- or n- or p-region. According to the invention, the two inner regions ($p^{+}$ and i in FIG. 1) of the avalanche diode are given approximately the same length.

The field distribution exemplified in FIG. 1 occurs not only in $n^{++}$-$p^{+}$-i-$p^{++}$ or inverse structures, but at high current densities also in $n^{++}$-i-$p^{++}$ structures. Due to the coupling of the two carrier generating regions located at the margin of the space charge zone of an avalanche diode according to the invention, and on account of the smaller multiplication factors resulting from the high current densities in the two regions of this diode, the expectable noise components are lower than with the heretofore known modes of operation involving lower current densities and higher multiplication factors. Furthermore, the mutual effect between the two carrier generating regions results in a favorable dependence of the oscillating frequency upon the direct-current intensity, for example for such purposes as frequency modulation.

The principles underlying the present invention are more fully dealt with by B. Höfflinger in IEEE Trans. ED–13, No. 1, 1966, page 151 (Special Issue on Semiconductor Bulk-Effect and Transit-Time Devices) for the quasi-stationary case, and by B. Höfflinger in Solid State Communications, vol. 4, page 287, 1966, for transit-time operation.

Further details of the invention will be described with reference to the embodiments of avalanche diodes according to the invention illustrated in FIGS. 3 to 9 of the accompanying drawings. Corresponding items are designated by the same reference characters respectively.

The avalanche diode of FIG. 3 has the doping profile $p^{++}$-$n^{+}$-n-$n^{++}$.

The base crystal 1 consists of a semiconductor material in which the two charge carriers (electrons and holes) have approximately the same saturation speeds. This applies particularly to Si, Ge and GaAs.

A high-ohmic n-type layer is epitaxially deposited upon an $n^{++}$ substrate. Large tolerances are permissible. The epitaxial growth of the low-ohmic $n^{+}$ layer, however, must be effected with small tolerances in order to preserve a constant optimal in-diffusion depth. After suitable masking, boron is diffused into the crystal on a ring-shaped area and with small tolerances, applying a surface concentration of $10^{16}$ cm.$^{-3}$. The p-n junction is produced by a relatively shallow in-diffusion of boron through the mask 4 with a surface concentration of approximately $10^{21}$ cm.$^{-3}$. Due to the slight diffusion depth, a nearly planar and abrupt junction is obtainable.

Relative to the just mentioned diffusion process, reference may be had to the copending application of M. Zerbst et al., Ser. No. 499,610, filed Oct. 21, 1965, illustrating and describing more in detail the ring-shaped in-diffusion at a zone surrounding the periphery of a disc-shaped p-n junction, this zone having the same conductivity type as the highly-doped outer zone located at the p-n junction but having a lower dopant concentration as this outer zone.

The contact electrode 2 of gold is vapor-deposited upon the highly doped $n^{++}$ outer zone; and a contact electrode of silver 3 is vapor-deposited upon the highly doped $p^{++}$ outer zone.

FIG. 4 shows a section through an avalanche diode 1 having the doping profile $p^{++}$-i-$n^{++}$. The crystal 1 in this and all other embodiments herein described consists of a semiconductor material in which the two charge carriers (electrons and holes) have approximately the same saturation speeds, particularly of Si, Ge or GaAs.

Epitaxially grown upon the $n^{++}$ substrate is an i-layer with slight tolerances wtih respect to layer thickness. The surface is masked, and boron is in-diffused with slight tolerances, applying a surface concentration of approximately $10^{21}$ cm.$^{-3}$. The in-diffusion is effected down to a relatively large depth, thus achieving a breakthrough of the residual thickness and avoiding the breakthrough at the margin curvature usually occurring in diffusion processes. The silver contact 3 and the gold contact 4 are deposited by vapor deposition. The diode is soldered into the capsule as illustrated in FIG. 6 and described in a later place.

FIG. 5 shows a section through an avalanche diode 1 having the doping profile $p^{++}$-$n^{+}$-n-$n^{++}$.

The high-ohmic n-type layer of the base crystal 1 is epitaxially grown on the $n^{++}$ substrate. According to the invention, phosphorus is first in-diffused into this layer with a surface concentration of approximately $10^{16}$ cm.$^{-3}$ down to a depth of approximately 4 $\mu$m. The opening of the $SiO_2$ diffusion mask employed for this purpose has a diameter of approximately 100 $\mu$m. Thereafter, an $SiO_2$ mask 4, whose opening has a larger diameter, preferably about 300$\mu$m., is employed and boron is in-diffused through the mask opening with a surface concentration of approximately $10^{21}$ cm.$^{-3}$. The diffusion depth is kept shallow, namely smaller than the depth of the phosphorous zone first diffused into the crystal. For this purpose, the first applied diffusion mask is preferably removed entirely, and thereafter the second mask having the larger opening diameter is applied. Such a double diffusion process is particularly favorable for producing a hyper-abrupt junction.

Silicon structures inversely related to those illustrated in FIGS. 3 to 5 are obtained if in the above-described process there is used Ga instead of P or Sb, and if As is used instead of B.

In the diode capsule shown in FIG. 6, the diode 1 with its contacts 2, 3 and the $SiO_2$ mask 4, is surrounded by a ring 5 of ceramic material. The gold contact 2 is seated upon a base plate 6. The silver contact 3 is connected through a pressure contact stirrup with the cover 8 of the diode capsule.

The oscillator shown in FIG. 7 comprises an avalanche diode, according to the invention for generation of oscillations, preferably under transit-time conditions. The oscillator is constituted essentially by a hollow conductor of rectangular cross-sectional shape and has a resonator portion 10 of reduced height. A contact plunger 9 is screwed into a threaded opening of one of the wide lateral walls of the resonator 10. Screwed into the opposite side wall of the resonator 10 is a lead-through capacitor 11 whose inner conductor abuts against the diode 1. When the contact plunger 9 is tightened it presses the diode against the inner conductor. Direct voltage is supplied from a source 14 to the diode through the inner and outer conductors of the capacitor. The high frequency is decoupled through a decoupling diaphragm 13. A junction piece 15 extends between the diaphragm 13 and the hollow conductor having the normal, larger cross section. A short-circuiting slider 12 is mounted in the side of the hollow-space resonator 10 remote from the diaphragm 13.

The heat evolving in the diode 1 is dissipated through the contact plunger 9 and the adjacent lateral wall of the hollow resonator 10 into an attached heat sink or cooling device 16.

The fact that an avalanche diode according to the invention constitutes a negative resistance in transit-time operation within a given frequency range of the particular operation, may also be utilized for obtaining an amplication of oscillations in this frequency range with the aid of a non-reciprocal component.

One way of separating the input and output signal in an oscillator as shown in FIG. 7, is to build into the coupling conductor of the resonator a component of the type known as "circulator." A circulator, also called directional fork, constitutes a four-way wave switch with coupling localities at A, B, C and D (FIG. 8). The wave entering at A can issue only from B. A wave entering at B can issue only at C. A wave entering at C can reach only D; and a wave from D can reach only A.

For amplifying oscillations with the aid of an avalanche diode according to the invention, the following way may be chosen, for example. Connected to the arm A of the circulator is a coupling-in hollow conductor 17, connected to the arm B is the hollow conductor 15 of the conductor 17, connected to the arm B is the hollow conductor 15 of the resonator. Connected to the arm C is the decoupling hollow conductor 18. For realizing such a circulator there are employed ferrites utilizing the Faraday rotation or the non-reciprocal phase shift of the ferrite material.

According to the schematically simplified view of such an amplifying arrangement shown in FIG. 8, the circulator 19 with coupling localities A, B, C and D is arranged between the transition piece 15 shown in FIG. 7, the high-frequency input 17 and the high-frequency output 18. The signal to be amplified is coupled through the HF input 17 into the circulator 19 and the transition piece 15 to enter into the oscillator illustrated in FIG. 7. In the circulator 19 a wave entering at A can reach only the arm B, and a wave entering at B can reach only C. The amplified signal, therefore, can be taken off only at arm C constituting the high-frequency output 18. The arrows 20 denote the propagating direction of the high-frequency wave to be amplified. The arrows 21 denote the propagating direction of the HF wave amplified in the device.

FIG. 9 shows in section an osicllator equipped with an avalanche diode according to the invention for generating oscillations preferably under quasi-stationary conditions. The oscillator is constituted by a coaxial, unilaterally tunable resonator 22. A contact plunger 9 is in threaded engagement with the front wall of the resonator 22 and presses the avalanche diode 1 against the inner conductor of the coaxial resonator. The diode 1 is located in the current maximum of the resonator 22. The inner conductor is held in an insulating disc structure 23. The tuning slider 24 is direct-current insulated from the outer conductor, and direct voltage is applied from the source 14 between the outer and inner conductors respectively. The high frequency is decoupled through a decoupling loop 25. The heat generated in the diode is dissipated through the front wall into an adjacent heat sink or cooler 16.

To those skilled in the art it will be obvious upon a study of this disclosure that my invention permits of various other modifications and hence may be given embodiments other than particularly illustrated and described herein, without departing from the essential features of my invention and within the scope of the claims annexed hereto.

I claim:

1. An avalanche diode comprising a semiconductor body having two contact-carrying and highly doped outer zones of opposite conductivity type and an intermediate zone of lower dopant concentration bordered on opposite sides by said two outer zones respectively and active as a space charge region during diode operation, said intermediate zone forming at least one p-n junction with one of said outer zones and having a length less than 10 $\mu$m., said length being sufficient to enable the velocity of the charge carriers to saturate in response to the diode operating voltage applied in the inverse direction between the outer zone contacts, said intermediate zone having at least in a portion adjacent said p-n junction a dopant concentration higher than that of the remaining portion of said zone for causing the charge carriers produced at said p-n junction by said operating voltage to generate near the other outer zone an avalanche space charge, said diode having a negative resistance between said two contact-carrying outer zones caused by an amplification of said avalanche space charge by multiplication for compensating said operating voltage.

2. In an avalanche diode according to claim 1, wherein—for securing a negative resistance of the diode under quasi-stationary conditions—said intermediate zone having a length less than 10 $\mu$m. and having at least in a portion adjacent said p-n junction a dopant concentration higher than that in the remaining part of said zone so that at said operating voltage the transit time of the charge carriers resulting from multiplication at the p-n junction is less than that of the period of the generated oscillation.

3. In an avalanche diode according to claim 1, wherein—for securing a negative resistance of the diode under transit-time conditions—said intermediate zone having at least in a portion adjacent said p-n junction a dopant concentration higher than that in the remaining part of said zone so that at said operating voltage and at a saturation velocity of the two carrier types determined by the semiconductor material of the diode the transit-time of the charge carriers produced by multiplication at said p-n junction, as well as the transit time of the charge carriers of the opposite type produced by induced multiplication at the other end of said intermediate zone, correspond approxmiately to an odd multiple of a quarter of the periodicity of the oscillation to be amplified or excited.

4. In an avalanche diode according to claim 1, wherein the avalanche injection during diode operation occurs unilaterally from the reversely biased p-n junction and multiplication is induced at the other end of said intermediate zone opposite said p-n junction, said portion adjacent said p-n junction having a length substantially the same as that of said remaining portion of said zone.

5. In an avalanche diode according to claim 1, said crystal consisting of semiconductor material wherein the two types of charge carriers have substantially the same saturation velocities, said material being selected from the group consisting of silicon, germanium and gallium arsenide.

6. In an avalanche diode according to claim 1, the charge carrier density ($J/v$) corresponding to the quotient of current density J and charge carrier velocity $v$ is greater than about 0.5 times the dopant concentration in said portion of said intermediate zone adjacent said p-n junction during diode operation.

7. In an avalanche diode according to claim 1, the charge carrier density ($J/v$) corresponding to the quotient of current density J and charge carrier velocity $v$ is between approxmiately 0.5 and 1 times the dopant concentration in said intermediate zone.

8. In an avalanche diode according to claim 1, said intermediate zone having $p^+$ conductivity and a dopant concentration of $10^{16}$ cm.$^{-3}$, said $p^+$ intermediate zone having a length of about 0.8 to 1.5 $\mu$m.

9. In an avalanche diode according to claim 1, said space charge zone having a length and a doping at which the field strength in the region of the space charge zone remote from the p-n junction is larger than about 5 kv./cm. when during diode operation the breakthrough field strength $E_B$ is reached at the reversely biased p-n junction.

10. In an avalanche diode according to claim 9, said space charge zone having a dopant concentration at which said field strength in said region remote from said p-n junction is larger than about 5 kv./cm. and smaller than about 0.5 times the breakthrough field strength ($E_B$) at said p-n junction.

11. An avalanche diode according to claim 1 having one of the doping profiles $p^{++}$-$p^+$-$n^{++}$ and $p^{++}$-$n^+$-$n^{++}$, the avalanche injection during diode operation being unilateral from the reversely biased p-n junction, and said space charge zone having a length dimensioned for a field strength of 0.5 to 0.2 $E_B$ in the intermediate-zone region remote from said p-n junction, $E_B$ denoting the breakthrough field strength.

References Cited

UNITED STATES PATENTS

| | | | |
|---|---|---|---|
| 2,899,646 | 8/1959 | Read | 317—234 |
| 3,270,293 | 8/1966 | De Loach et al. | 317—234 |
| 3,293,010 | 12/1966 | Hackley | 317—234 |
| 3,319,138 | 5/1967 | Bergman et al. | 317—235 |
| 3,345,221 | 10/1967 | Lesk | 317—234 |

JERRY D. CRAIG, Primary Examiner

U.S. Cl. X.R.

331—107; 148—175